United States Patent [19]
Sakurai et al.

[11] Patent Number: 6,160,459
[45] Date of Patent: Dec. 12, 2000

[54] TEMPERATURE-COMPENSATED CRYSTAL OSCILLATOR

[75] Inventors: Yasuhiro Sakurai; Hiroyuki Fukayama, both of Sayama, Japan

[73] Assignee: Citizen Watch Co., Ltd., Tokyo, Japan

[21] Appl. No.: 09/373,236

[22] Filed: Aug. 12, 1999

[30] Foreign Application Priority Data

Feb. 16, 1998 [JP] Japan ................................. 10-32623

[51] Int. Cl.$^7$ ............................. H03B 5/04; H03B 5/32; H03B 5/36
[52] U.S. Cl. ................................. 331/158; 331/116 FE; 331/175; 331/176; 331/186
[58] Field of Search ............................. 331/34, 57, 66, 331/116 R, 116 FE, 116 M, 117 R, 117 FE, 117 D, 158, 175, 176, 177 R, 185, 186; 310/315, 318

[56] References Cited

U.S. PATENT DOCUMENTS 4,783,620  11/1988  Kitagawa et al. ..................... 323/313

*Primary Examiner*—David Mis
*Attorney, Agent, or Firm*—Armstrong, Westerman, Hattori, McLeland & Naughton

[57] ABSTRACT

In a temperature-compensated crystal oscillator wherein a temperature-compensated crystal oscillation circuit is driven by a constant voltage generation circuit, the constant voltage generation circuit comprises a differential circuit, a dc load for supplying feedback signals to the differential circuit, a first driver for driving the dc load under control of the differential circuit, a phase-compensation capacitor coupled between a control terminal of the first driver and an output terminal thereof and a second driver for driving the temperature-compensated crystal oscillation circuit. The second driver is the same kind of device as is used for the first driver, and is under control by the same control signal as a control signal for the first driver, sent out by the differential circuit.

6 Claims, 3 Drawing Sheets

TEMPERATURE-COMPENSATED CRYSTAL OSCILLATOR

BACKGROUND OF THE INVENTION

1. Field of the Invention

The present invention relates to a temperature-compensated crystal oscillator mounted in communications equipment such as a cellular phone, and the like.

2. Description of the Related Art

A temperature-compensated crystal oscillator mounted in communications equipment comprises a crystal oscillation circuit incorporating an AT-cut crystal resonator (unit) in a frequency band of 10 MHz as the oscillation source thereof, and a temperature-compensated circuit using a frequency adjustment circuit for adjusting an oscillation frequency of the crystal oscillation circuit so as to stabilize the oscillation frequency by canceling out the cubic curve temperature characteristic of the AT-cut crystal resonator.

Since the temperature-compensated crystal oscillator is mounted in portable communications equipment, there is a requirement that its power consumption is low. However, the temperature-compensated crystal oscillator is specified such that the power source thereof is to be kept turned off during most of times when standing by for phone calls, and consequently, even a product thereof with a power source at 3V, having current consumption of not less than 1 mA, has been permissible in the past.

As there has recently been seen a mounting trend of adopting the CDMA (code division multiple access) system aiming at international sharing of a common communications system, and under the specification of the CDMA system, the temperature-compensated crystal oscillator is required not to turn the power source thereof off even during periods of standing by for phone calls, there has been an increasing demand for further lower power consumption.

Now, the most effective method of achieving lower power consumption is to lower a driving voltage of the crystal oscillation circuit.

Accordingly, for a temperature-compensated crystal oscillator aiming at lower power consumption, a configuration is adopted wherein a temperature-compensated crystal oscillation circuit is driven by a constant voltage generation circuit (a voltage regulator).

FIG. 5 shows a configuration of such a conventional temperature-compensated crystal oscillator by way of example. With this type of temperature-compensated crystal oscillator, a temperature-compensated crystal oscillation circuit 1 is driven by a constant voltage generation circuit 3.

The constant voltage generation circuit 3 comprises a differential circuit 5 supplied with a reference voltage A as one of the inputs, a dc load 7, a driver 9 by use of a FET for driving the dc load 7 and the temperature-compensated crystal oscillation circuit 1 under control of the differential circuit 5, and a phase-compensation capacitor 11 for prevention of self-oscillation.

The dc load 7 has a function of supplying feedback signals to the differential circuit 5, and determining a ratio of the reference voltage A to a driving voltage for the temperature-compensated crystal oscillation circuit 1, that is, an amplification factor. In this example, the dc load 7 comprises a first resistance 7a and a second resistance 7b that are identical in kind and connected in series.

The differential circuit 5 shown in FIG. 5 is made up of CMOS FETs using either an n-type substrate or a p-type substrate, however, it can also be made up of bipolar transistors.

The dc load 7 is not an essential constituent element of the constant voltage generation circuit 3 shown in FIG. 5. If the reference voltage A equivalent to the driving voltage for the temperature-compensated crystal oscillation circuit 1 is available, the dc load 7 may be dispensed with, and an output of he driver 9 may be supplied straight to the differential circuit 5 as the feedback signals thereto.

In any case, lower power consumption of the temperature-compensated crystal oscillator can be achieved by rendering the diving voltage for the temperature-compensated crystal oscillation circuit 1 lower than a source voltage V1–V2 (normally, V2=ground potential) with the use of the constant voltage generation circuit 3.

However, in the case where the temperature-compensated crystal oscillation circuit 1 is driven by use of the constant voltage generation circuit 3 in this way, there will arise a problem that phase noise increases in comparison with a case where the temperature-compensated crystal oscillation circuit 1 is driven directly by the source voltage.

The reason for this is described hereinafter.

The constant voltage generation circuit 3 of the temperature-compensated crystal oscillator is provided with the driver 9 having a small on-resistance, and performs feedback control such that an output voltage thereof is kept at the reference voltage A multiplied by a constant factor. And the feedback control is performed by use of the differential circuit 5.

The feedback control is a prerequisite for the constant voltage generation circuit 3, because a constant voltage can be outputted by the feedback control even in the case of manufacturing variation of device characteristics, variation in the source voltage, variation in load, and so forth.

Meanwhile, the temperature-compensated crystal oscillation circuit 1 is a stable load on a long term basis, however, has a characteristic of current thereof pulsating on a shorter term basis, depending on a phase condition of oscillation. That is, it is a load having a property of its impedance undergoing changes on a shorter term basis.

If such a variable load on a short term basis is driven by the conventional constant voltage generation circuit 3, the variable load is contained in feedback loop, so that signals fed back to the differential circuit 5 are caused to pulsate.

Consequently, the constant voltage generation circuit 3 performs an operation so as to cancel out variation in the load in order to keep the output voltage thereof at a constant level. If the constant voltage generation circuit 3 has a response speed fast enough to be able to follow variation in the load at a frequency of the temperature-compensated crystal oscillation circuit 1, the output voltage can be maintained at the constant level.

However, in the constant voltage generation circuit 3, it is extremely difficult to operate the differential circuit 5 controlling the driver 9 at such a high speed enabling the same to follow the variation in the load of the temperature-compensated crystal oscillation circuit 1 in the frequency band of 10 MHz.

Accordingly, in response to the variation in the frequency band of 10 MHz of the temperature-compensated crystal oscillation circuit 1, the constant voltage generation circuit 3 performs an operation so as to compensate for the variation in the load at a frequency (for example, in the order of 1 kHz) lower than that for the former.

More specifically, the variation in the load proceeds at a speed higher than a speed at which the constant voltage generation circuit 3 operates to maintain the output voltage thereof at the constant level. Hence the output voltage can not be maintained at the constant level displaying a characteristic of undergoing variation at a frequency lower than that in the frequency band of 10 MHz.

Since an oscillation frequency of the temperature-compensated crystal oscillation circuit 1 varies depending on the driving voltage, the oscillation frequency of the temperature-compensated crystal oscillation circuit 1 undergoes fine modulation when the output voltage of the constant voltage generation circuit 3 varies at a certain frequency. The fine modulation of the oscillation frequency will show up in the form of deterioration in phase noise.

That is, the cause for the deterioration in phase noise occurring when the temperature-compensated crystal oscillation circuit 1 is driven by the constant voltage generation circuit 3 is that short term variation in the load proceeding at a high speed is fed back to the differential circuit 5.

SUMMARY OF THE INVENTION

An object of the invention is to provide a temperature-compensated crystal oscillator wherein a temperature-compensated crystal oscillation circuit is driven by use of a constant voltage generation circuit, thereby achieving low power consumption while keeping phase noise low.

To this end, with a temperature-compensated crystal oscillation according to the invention, wherein a temperature-compensated crystal oscillation circuit is driven by a constant voltage generation circuit, the constant voltage generation circuit comprises a differential circuit, a dc load for supplying feedback signals to the differential circuit, a first driver for driving the dc load under control of the differential circuit, a phase-compensation capacitor coupled between a control terminal of the first driver and an output terminal thereof, and a second driver for driving the temperature-compensated crystal oscillation circuit.

The second driver is the same kind of device as is used for the first driver, and under control by the same control signal as a control signal for the first driver, sent out by the differential circuit.

With the temperature-compensated crystal oscillator, it is desirable that an output voltage of the second driver is equivalent to an output voltage of the first driver.

Further, it is desirable that a current flowing through the dc load is smaller in strength than an average current flowing through the temperature-compensated crystal oscillation circuit.

Furthermore, it is preferable that a reciprocal of a ratio of an on-resistance of the first driver to that of the second driver is rendered substantially equivalent to a ratio of the current flowing through the dc load to the average current flowing through the temperature-compensated crystal oscillation circuit.

It is also preferable that both the first driver and the second driver are MOS transistors having an identical channel length, respectively, and a ratio of a channel width of the first driver to that of the second driver is substantially equivalent to a ratio of the current flowing through the dc load to the average current flowing through the temperature-compensated crystal oscillation circuit.

Now, the first driver performs a function of driving the dc load and maintaining an output voltage of the constant voltage generation circuit at a constant level by feeding back the output voltage or a divided voltage thereof to the differential circuit.

The second driver functions for driving the temperature-compensated crystal oscillation circuit, however, a control signal of the second driver is the same as a control signal of the first driver, and simply supplied thereto with the result that the output voltage of the second driver is not fed back to the differential circuit. That is, the second driver is under at open loop control.

However, since the second driver is controlled by the same control signal as that of the first driver which is under feedback control the second driver as well operates as if it is under feedback control in respect of variation in the source voltage and manufacturing variation of the device characteristics.

That is, only in the case where variation occurs to a load, namely, the temperature-compensated crystal oscillation circuit, the second driver will not feed back the variation, but it can be said that a feedback loop is provided in respect of other variations.

Since the temperature-compensated crystal oscillation circuit is a very stable load with little variation with the elapse of time once a constant therefor is determined, there is no need of taking into account variations in the load on a long term basis.

Accordingly, it can be said that the second driver as well is in effect under feedback control thereby satisfying requirements of the constant voltage generation circuit.

It is evident that lower power consumption of the temperature-compensated crystal oscillator can be attained by driving the temperature-compensated crystal oscillation circuit through operation of the constant voltage generation circuit which is set to generate a voltage lower than the source voltage.

Now the reason why the configuration of the temperature-compensated crystal oscillator according to the invention is capable of preventing deterioration in phase noise is described hereinafter.

As described above, the cause for deterioration in phase noise occurring when the temperature-compensated crystal oscillation circuit is driven by the constant voltage generation circuit is that short term variation in load taking place at a high speed in the temperature-compensated crystal oscillation circuit is fed back to the different circuit.

Accordingly, it is sufficient for prevention of deterioration of phase noise to remove the temperature-compensated crystal oscillation circuit from the feedback loop of the constant voltage generation circuit.

However, since simple open loop control does not meet the requirements of the constant voltage generation circuit, a feedback mechanism needs to be provided somewhere.

Hence, with the temperature-compensated crystal oscillator according to the invention, the feedback loop is made up of the differential circuit, the dc load, and the first driver, and the second driver for driving the temperature-compensated crystal oscillation circuit is removed from the feedback loop as described in the foregoing.

As a result, the output voltage of the second driver is a constant voltage on average over time, however, it is subjected to pulsation on a shorter term basis in synchronization with the oscillation of the temperature-compensated crystal oscillation circuit.

Even though the output voltage of the second driver undergoes pulsation, such pulsation is in synchronization with the oscillation of the temperature-compensated crystal oscillation circuit, and consequently, a frequency of the pulsation matches up with an oscillation frequency of the temperature-compensated compensated crystal oscillation circuit.

Hence, there exists no frequency component causing deterioration of phase noise by modulating the oscillation frequency of the temperature-compensated crystal oscillation circuit.

This is the reason why the temperature-compensated crystal oscillator according to the invention, although provided with the constant voltage generation circuit, is capable of preventing deterioration of phase noise.

Now, as far as an object of lowering power consumption is concerned, the output voltage of the first driver need not necessarily be the same as that of the second driver. However, from the viewpoint of preventing variation in the oscillation frequency due to variation in the source voltage, the variation in the source voltage needs to be eliminated from a voltage for driving the temperature-compensated crystal oscillation circuit.

The constant voltage generation circuit of the temperature-compensated crystal oscillator according to the invention has a characteristic such that the greater a difference between the output voltage of the second driver and the output voltage of the first driver is, the wider the variation in the output voltage of the second driver, due to the source voltage becomes.

Hence, in order to stabilize the oscillation frequency against the variation in the source voltage, the output voltage of the first driver is preferably rendered the same as that of the second driver.

A method of equalizing the output voltages of both the drivers is to set dimensions, etc., of the drivers such that a reciprocal of a ratio of an on-resistance of the first driver to that of the second driver is substantially equivalent to a ratio of a current flowing trough the dc load to an average current flowing through the temperature-compensated crystal oscillation circuit.

However, there are cases where the oscillation fifty is hardly dependent on the driving voltage owing to paramets of the temperature-compensated crystal oscillation circuit, and in such cases, there is no need of equalizing the output voltage of the first driver with that of the second driver.

Now, a current flowing through the dc load needs to be set at a small value because it will cause current consumption of the temperature-compensated crystal oscillator to increase.

Accordingly, the significance of driving the temperature-compensated crystal oscillation circuit by the constant voltage generation circuit will lessen unless the current flowing though the dc load is rendered at least smaller in strength than the average current flowing through the temperature-compensated crystal oscillation circuit.

The above and other objects, features and advantages of the invention will be apparent from the following detailed description which is to be read in conjunction with the accompanying drawings.

DETAILED DESCRIPTION OF THE PREFERRED EMBODIMENTS

Preferred embodiments of a temperature-compensated crystal oscillator according to the invention are described hereinafter with reference to the accompanying drawings.

Figure 1:
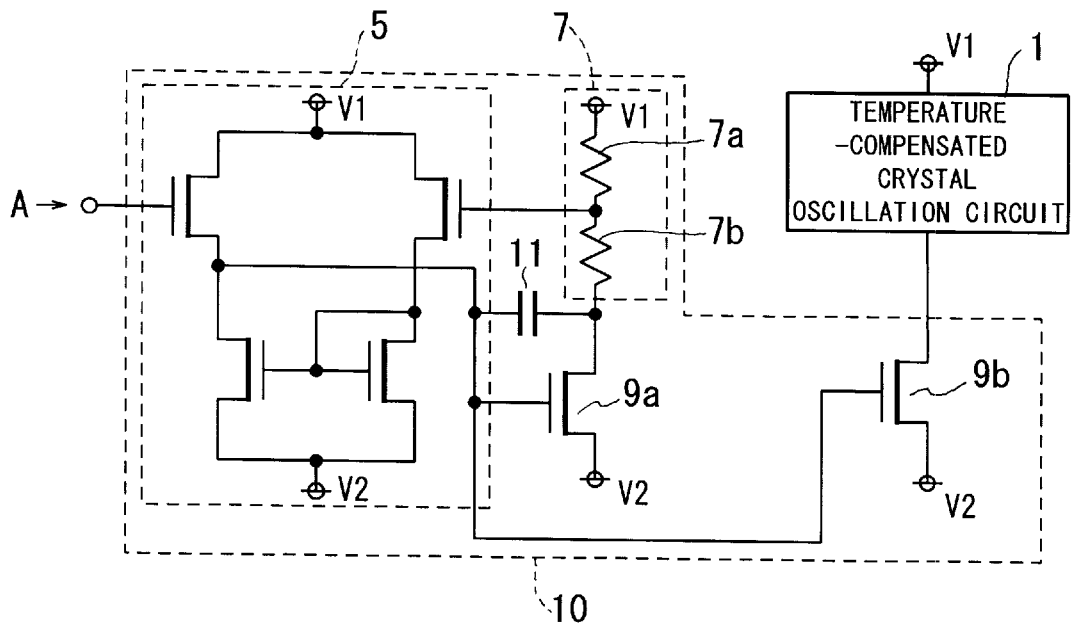
FIG. 1 is a block diagram showing an embodient of a temperature-compensated crystal oscillator according the invention.
Figure 5:
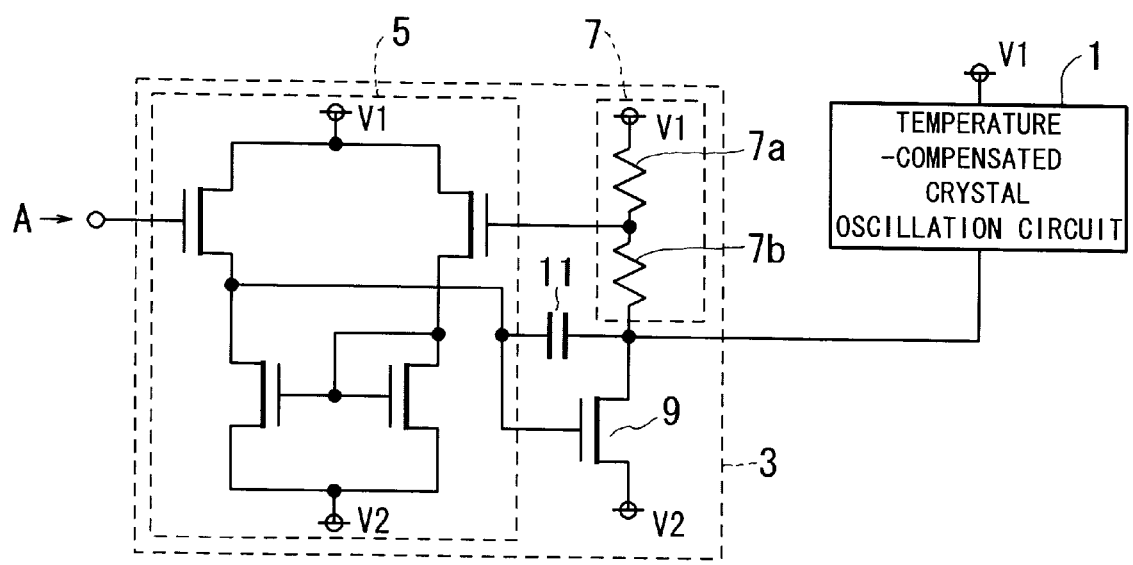
FIG. 5 is a block diagram showing a configuration of the conventional temperature-compensated crystal oscillator by way of example.

First, a configuration of one of the embodiments of the temperature-compensated crystal oscillator according to the invention is described with reference to FIG. 1. In FIG. 1, parts corresponding to those previously described with reference to FIG. 5 are denoted by the same reference numerals.

With the temperature-compensated crystal oscillator shown in FIG. 1, a temperature-compensated crystal oscillation circuit 1 is driven by a constant voltage generation circuit 10.

Similarly to the conventional temperature-compensated crystal oscillator described with reference to FIG. 5 by way of an example, the constant voltage generation circuit 10 comprises a differential circuit 5 supplied with a reference voltage A as one of inputs, a dc load 7 for supplying feedback signals to the differential circuit 5, a first driver 9a for driving the dc load 7 under control of the differential circuit 5 and a phase-compensation capacitor 11 for prevention of self-oscillation. The dc load 7 comprises a first resistance 7a and a second resistance 7b that are identical in kind and connected in series.

The configuration is novel in that the constant voltage generation circuit 10 is provided with a second driver 9b for driving the temperature-compensated crystal oscillation circuit 1, installed separately from the first driver 9a. The second driver 9b comprises a device of the same kind as that for the first driver 9a, and has a control terminal connected to that of the first driver 9a.

As principal factors that cause deviation of an output voltage of a constant voltage generation circuit from a set value, there are generally cited variation in a source voltage, manufacturing variation of device characteristics, and variation in a load.

And a way to cope with the principal factors for these variations is so-called feedback control whereby an output voltage of a driver or a divided voltage thereof is fed back to a differential circuit.

In the constant voltage generation circuit 10 shown in FIG. 1, a divided voltage of an output of the first driver 9a, across the first resistance 7a and the second resistance e 7b, is fed back to the differential circuit 5 from the dc load 7. That is, the first driver 9a and the dc load 7 make up a feedback loop.

By the agency of the feedback loop, the output of the first driver 9a will not vary depending on variation in the source voltage, manufacturing variation of the device characteristics and variation in the load, and can be maintained at a constant value, that is, the reference voltage A multiplied by a constant factor.

On the other hand, an output voltage of the second driver 9b or a divided voltage thereof is not fed back to the differential circuit 5. Such a configuration appears not to meet requirements for outputting a constant voltage.

However, since the second driver 9b is controlled by the same control signal as a control signal for the first driver 9a, it is reasonable to regard the second driver 9b as well under feedback control in respect of variation in the source voltage.

Further, it is desirable that both the first driver 9a and the second driver 9b are devices identical in kind that are fabricated by means of the same fabrication process, and if so, the second driver 9b can be regarded as indirectly under feedback control via the first driver 9a in respect of manufacturing variation of the device characteristics as well.

It is only in respect of variation in the load that the second driver 9b is not under feedback control.

That is, in case that variation in the load occur to the temperature-compensated crystal oscillation circuit 1, this will cause the output voltage of the second driver 9b to deviate from the set value. However, with the configuration of the constant voltage generation circuit 10 shown in FIG. 1, there exists no means at all for correcting such deviation.

The temperature-compensated crystal oscillation circuit 1, which is an oscillation circuit, represents a load repeating periodic variation. Consequently, the output voltage of the second driver 9b also repeats periodic variation.

However, since the variation in the output voltage described above is completely passive, and simply following the variation in the load occurring to the temperature-compensated crystal oscillation circuit 1, variations of both are in synchronization with each other. That is, a frequency of the variation in the output voltage of the second driver 9b is equivalent to an oscillation frequency of the temperature-compensated crystal oscillation circuit 1.

Accordingly, there exists no frequency component other than the oscillation frequency of temperature-compensated crystal oscillation circuit 1. Hence the oscillation frequency of the temperature-compensated crystal oscillation circuit 1 will not undergo modulation even if variation occurs to the output voltage of the second driver 9b.

With the configuration of the temperature-compensated crystal oscillator shown in FIG. 1, it follows that there will occur no deterioration in phase noise that is attributable to the constant voltage generation circuit 10. And for achieving a principal object of employing the constant voltage generation circuit 10, that is, curbing of power consumption, it is sufficient to set the output voltage of the second driver 9b at a level lower than the source voltage.

Thus, with the configuration of the temperature-compensated crystal oscillator as shown in FIG. 1, an object of the invention can be achieved.

Now a method of setting the output voltage of the second driver 9b is described hereinafter.

Figure 2:
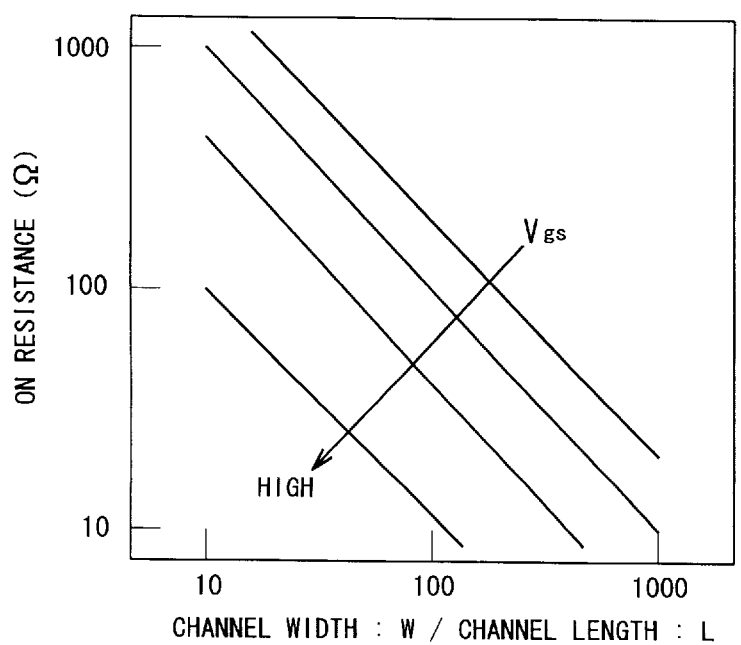
FIG. 2 is a graph showing an example of on-resistance of MOS transistors used in the temperature-compensated crystal oscillator shown in FIG. 1.

FIG. 2 is a graph showing a relationship between a ratio of a channel width W of a MOS transistor to a channel length L thereof; W/L and on-resistance thereof with a gate voltage as a parameter when the driver is made up of the MOS transistor.

In this case, the on-resistance of the MOS transistor is defined as a ratio of a drain-source voltage Vds of the MOS transistor to a drain-source current Ids thereof (Vds/Ids). Since the MOS transistor has a constant current characteristic relative to the drain-source voltage Vds, a comparison of the on-resistance is not possible unless the drain-source voltage Vds is fixed at a certain value.

Accordingly, the on-resistance is compared herein by fixing the drain-source voltage Vds at 1V. It follows in consequence that a reciprocal of the drain-source current Ids is the on-resistance.

Electrical characteristic shown in FIG. 2 indicates the relationship between the on-resistance of a MOS transistor and the ratio of the channel width W of the MOS transistor to the channel length L thereof; W/L, by way of a logarithmic graph. However, since the on-resistance of the MOS transistor varies depending on a gate voltage Vgs, the gate voltage Vgs also is shown as a parameter.

As is evident from FIG. 2, the on-resistance of the MOS transistor is inversely proportional to the ratio of the channel width W to the channel length L; W/L.

In other words, the on-resistance is proportional to the channel length L if the channel width W is constant, and inversely proportional to the channel width W if the channel length L is constant.

Further, as is evident from the definition of the on-resistance, the drain-source voltage Vds is the product of the drain-source current Ids and the on-resistance of the MOS transistor.

Accordingly, the drain-source voltage Vds can be matched up even between MOS transistors with the different current from each other by varying the channel width W or the channel length L for adjustment of the on-resistance.

Taking advantage of such property of the MOS transistors as described, the output voltage of the second driver 9b shown in FIG. 1 can be matched up with the output voltage of the first driver 9a. That is, the output voltage of the first driver 9a and a current flowing through the dc load 7 are determined on the basis of the reference voltage A and the dc load 7.

Hence by checking up beforehand a relationship between a voltage for driving the temperature-compensated crystal oscillation circuit 1 and an average current flowing through the temperature-compensated crystal oscillation circuit 1, it is possible to find out a multiplying factors by which a current flowing through the dc load 7 is to be multiplied so as to match up with the average current flowing through the temperature-compensated crystal oscillation circuit 1 when the temperature-compensated crystal oscillation circuit 1 is driven by the same voltage as the output voltage of the first driver 9a.

Then, a ratio of a channel width Wa of the first driver 9a to a channel length La thereof; Wa/La, is multiplied by the multiplying factor, and the product of such multiplication can be adopted as a ratio of a channel width Wb of the second driver 9b to a channel length Lb thereof, Wb/Lb.

Since the drivers are required to have a current driving capacity that is large to some extent, there is usually no need of rendering the channel length L too long. On the other land if the channel length L is rendered too short, the MOS transistors are unable to deliver their performance owing to the short channel effect.

As a result, there is hardly any choice in respect of the channel length L, and consequently, the on-resistance of the drivers is usually adjusted by varying the channel width W, while both drivers often have the channel length L in common.

Thus, the output voltage of the second driver 9b can be matched up with the output voltage of the first driver 9a. The method of setting the output voltage of the second driver 9b is as described above.

Evidently, as far as lowering of power consumption of the temperature-compensated crystal oscillator is concerned, there is no need of matching up the output voltage of the second driver 9b with the output voltage of the first driver 9a. Hence it is not necessarily required to set the output voltage of the second driver 9b according to this method. The output voltage of the second driver 9b may be set according to another optional method without causing any problem.

However, with the configuration of the temperature-compensated crystal oscillator shown in FIG. 1, another advantageous effect can result when the output voltage of the second driver 9b is matched up with the output voltage of the first driver 9a. Such an advantageous effect will be described hereinafter.

In most cases, the oscillation frequency of the temperature-compensated crystal oscillation circuit 1 is dependent on the driving voltage thereof. Under the present specification, variation in the source voltage at an oscillation frequency permissible to the temperature-compensated crystal oscillator is within 0.3 ppm or 0.2 ppm at 3V±0.15V.

The simplest method of meeting such specification is to eliminate variation in the source voltage from the output voltage of the constant voltage generation circuit 10 for driving the temperature-compensated crystal oscillation circuit 1.

With the constant voltage generation circuit 3 of the conventional temperature-compensated crystal oscillator shown in FIG. 5, the temperature-compensated crystal oscillation circuit 1 is driven by the output voltage thereof under feedback control, and in consequence, the variation in the source voltage will not occur.

However, with the constant voltage generation circuit 10 of the temperature-compensated crystal oscillator according to the invention, shown in FIG. 1, the greater a difference between the output voltage of the second driver 9b which is a driving voltage for the temperature-compensated crystal oscillation circuit 1 and the output voltage of the first driver 9a is, the wider the variation in the source voltage becomes.

Figure 3:
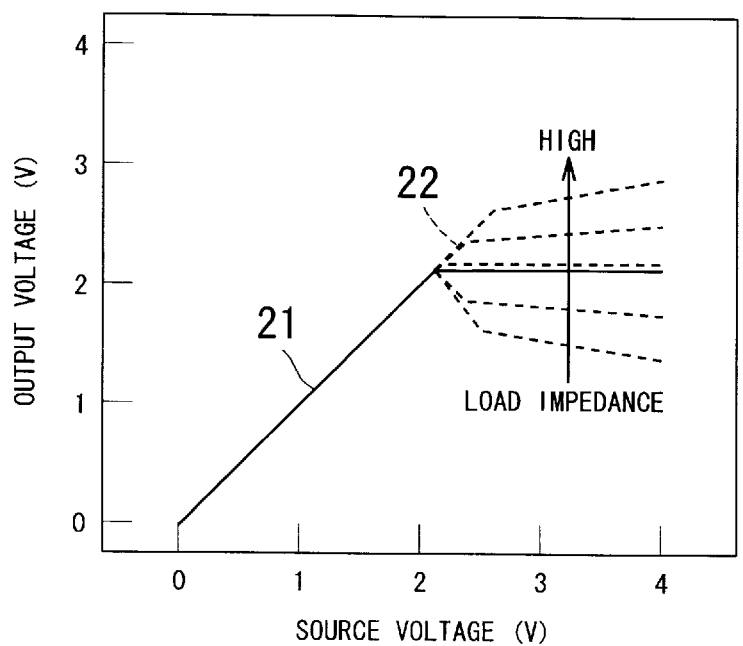
FIG. 3 is a graph showing an example of source voltage dependence of an output voltage of a first driver as well as a second driver, used in the temperature-compensated crystal oscillator shown in FIG. 1.

FIG. 3 is a graph showing the source voltage dependence of both the output voltage of the first driver 9a and the output voltage of the second driver 9b with a load impedance thereof as parameter, and in the figure, a solid line 21 indicates the output voltage of the first driver 9a while a broken line 22 indicates the output voltage of the second driver 9b, respectively.

As is evident from FIG. 3, the output voltage of the first driver 9a is not dependent on the source voltage and remains constant at the source voltage not lower than a set voltage of the first driver 9a.

Further, the greater a difference between the output voltage of the second driver 9b and the output voltage of the first driver 9a, the greater the source voltage dependence of the output voltage of the second driver 9b becomes (strength of tilt of the broken lines 22 in FIG. 3 increases), however, the output voltage of the second driver 9b is not dependent on the source voltage when the former is substantially equivalent to the output voltage of the first driver 9a indicated by the sold line 21.

Accordingly, if the output voltage of the second driver 9b is matched up with the output voltage of the first driver 9a, this enables the constant voltage generation circuit 10 shown in FIG. 1 to have an effect such that variation in the oscillation frequency of the temperature-compensated crystal oscillation circuit 1, caused by the source voltage, is eliminated.

In this connection, however, it is not required that the output voltage of the second driver 9b is completely the same as that of the first driver 9a, and as long as both outputs are close to each other, variation in the oscillation frequency, caused by the source voltage, can be contained within a tolerable range. The foregoing is an explanation on another advantageous effect previously described.

Now, since an object of using the constant voltage generation circuit 10 is to curb the power consumption of the temperature-compensated crystal oscillator, the driving voltage of the temperature-compensated crystal oscillation circuit 1 needs to be set as low as possible within a range enabling the temperature-compensated crystal oscillation circuit 1 to maintain oscillation.

Further, it is desirable that a current flowing through the dc load 7 is as small in strength as possible in order to curb the power consumption of the temperature-compensated crystal oscillation. The significance of installing the constant voltage generation circuit 10 lessens unless the current flowing trough the dc load 7 is rendered at least smaller in strength than an average current flowing through the temperature-compensated crystal oscillation circuit 1.

Next, the extent to which phase noise is improved with the configuration of the invention is described hereinafter.

Figure 4:
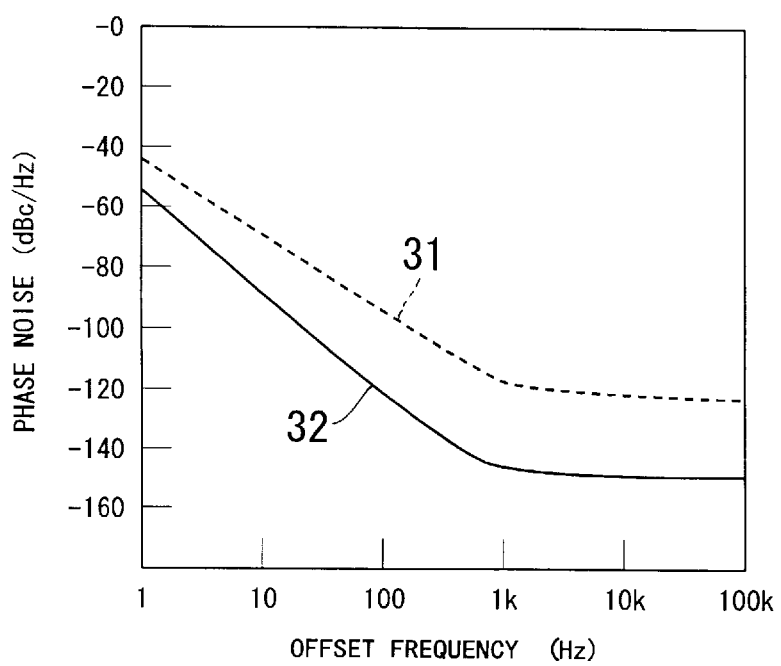
FIG. 4 is a graph showing an example of the comparison between phase noise of the temperature-compensated crystal oscillator according to the invention and that of a conventional temperature-compensated crystal oscillator.

FIG. 4 is a graph showing measured values of phase noise of the conventional temperature-compensated crystal oscillator as indicated by a broken line 31, and measured values of phase noise of the temperature-compensated crystal oscillator according to the invention as indicated by a solid line 32, respectively. In the figure showing phase noise, the lower the respective lines are positioned in the graph, the lower the phase noise as indicated by the respective lines is.

As is evident from FIG. 4, the phase noise of the temperature-compensated crystal oscillator according to the invention is noticeably lower in comparison with the phase noise of the conventional temperature-compensated crystal oscillator.

In particular, in the case of offset frequency at 1 kHz or higher (noise at a frequency deviated 1 kHz or more from the oscillation frequency), a remarkable effect of preventing deterioration of the phase noise can be observed.

While there has been described above in specific terms the embodiment of the temperature-compensated crystal oscillator according to the invention, it will be obvious to those skilled in the art that the invention is not limited thereto and that various changes and modifications may be made in the invention without departing from the spirit and scope thereof.

For example, with the embodiment described in the foregoing, the differential circuit and the respective drivers are made up of the MOS transistors, however, these may be made up of bipolar transistors.

Effect of the Invention.

As the foregoing description clearly shows, with the temperature-compensated crystal oscillator according to the invention, there has been adopted the configuration wherein the constant voltage generation circuit is provided with the driver making up a feedback loop and the other driver not making up a feedback loop, so that the temperature-compensated crystal oscillation circuit is driven by the driver not making up a feedback loop, and deterioration of phase noise can be thereby prevented while attaining low power consumption.

Accordingly, the invention can provide very advantageous effects if applied to temperature-compensated crystal oscillators and so forth to be mounted in cellular phones of which the CDMA specification is required.

What is claimed is:

1. A temperature-compensated crystal oscillator wherein a temperature-compensated crystal oscillation circuit is driven by a constant voltage generation circuit, said constant voltage generation circuit comprising:

a differential circuit;

a dc load for supplying feedback signals to the differential circuit;

a first driver for driving the dc load under control of the differential circuit;

a phase-compensation capacitor coupled between a control terminal of the first driver and an output terminal thereof; and a second driver which is the same kind of device as is used for the first driver, for driving the temperature-compensated crystal oscillation circuit under control by the same control signal as a control signal for the first driver, sent out by the differential circuit.

2. A temperature-compensated crystal oscillator according to claim 1, wherein an output voltage of the second driver is equivalent to an output voltage of the first driver.

3. A temperature-compensated crystal oscillator according to claim 1, wherein a current flowing through the dc load is smaller in strength than an average current flowing through the temperature-compensated crystal oscillation circuit.

4. A temperature-compensated crystal oscillator according to claim 2, wherein a current flowing the dc load is smaller in strength than an average current flowing through the temperature-compensated crystal oscillation circuit.

5. A temperature-compensated crystal oscillator according to claim 2, wherein a reciprocal of a ratio of an on-resistance of the first driver to that of the second driver is substantially equivalent to a ratio of a current flowing through the dc load to an average current flowing through the temperature-compensated crystal oscillation circuit.

6. A temperature-compensated crystal oscillator according to claim 2, wherein both the first driver and the second driver are MOS transistors having an identical channel length, respectively, and a ratio of a channel width of the first driver to that of the second driver is substantially equivalent to a ratio of a current flowing through the dc load to an average current flowing through the temperature-compensated crystal oscillation circuit.

* * * * *

UNITED STATES PATENT AND TRADEMARK OFFICE
CERTIFICATE OF CORRECTION

PATENT NO. : 6,160,459  
DATED : December 12, 2000  
INVENTOR(S) : Sakurai et al.

Page 1 of 1

It is certified that error appears in the above-identified patent and that said Letters Patent is hereby corrected as shown below:

<u>Column 12, claim 4,</u>  
Line 2, change "flowing the dc" to be -- flowing through the dc --

Signed and Sealed this

Nineteenth Day of February, 2002

Attest:

Attesting Officer

JAMES E. ROGAN  
*Director of the United States Patent and Trademark Office*